(12) United States Patent
Chen et al.

(10) Patent No.: US 7,915,128 B2
(45) Date of Patent: Mar. 29, 2011

(54) HIGH VOLTAGE SEMICONDUCTOR DEVICES

(75) Inventors: Yu Wen Chen, Baoshan Township (TW); Fu-Hsin Chen, Jhudong Township (TW); Ming-Ren Tsai, Sanchong (TW); William Wei-Yuan Tien, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 448 days.

(21) Appl. No.: 12/040,557

(22) Filed: Feb. 29, 2008

(65) Prior Publication Data

US 2009/0221118 A1 Sep. 3, 2009

(51) Int. Cl.
*H01L 21/336* (2006.01)

(52) U.S. Cl. ........ 438/299; 438/275; 438/629; 438/533; 438/276; 438/277; 257/E21.147; 257/E21.198; 257/E21.248; 257/E21.334; 257/E21.337; 257/E21.338; 257/E21.473

(58) Field of Classification Search .................... 438/299
See application file for complete search history.

(56) References Cited

U.S. PATENT DOCUMENTS

| | | | |
|---|---|---|---|
| 5,248,624 A | | 9/1993 | Icel et al. |
| 5,449,637 A | * | 9/1995 | Saito et al. ............. 438/227 |
| 5,455,444 A | * | 10/1995 | Hsue ....................... 257/413 |
| 5,485,024 A | | 1/1996 | Reay |
| 5,591,657 A | | 1/1997 | Fujishima et al. |
| 5,681,772 A | * | 10/1997 | Chen et al. ............. 438/290 |
| 5,770,485 A | * | 6/1998 | Gardner et al. ........ 438/162 |
| 5,854,110 A | * | 12/1998 | Kunitou ................. 438/275 |
| 5,985,711 A | * | 11/1999 | Lim ....................... 438/229 |
| 6,020,229 A | * | 2/2000 | Yamane et al. ......... 438/201 |
| 6,037,222 A | * | 3/2000 | Huang et al. .......... 438/257 |
| 6,048,785 A | * | 4/2000 | Fulford et al. ......... 438/621 |
| 6,218,247 B1 | * | 4/2001 | Yeuan ..................... 438/275 |
| 6,281,550 B1 | | 8/2001 | Chi |
| 6,727,534 B1 | | 4/2004 | Buller et al. |
| 6,753,235 B2 | * | 6/2004 | So et al. ................ 438/373 |
| 6,838,734 B2 | * | 1/2005 | Ker et al. ............... 257/360 |
| 6,969,642 B2 | * | 11/2005 | Yang et al. ............. 438/130 |
| 7,002,213 B2 | | 2/2006 | Chi |
| 7,235,476 B2 | * | 6/2007 | Nakagawa .............. 438/622 |
| 7,378,708 B2 | | 5/2008 | Lee et al. |
| 7,453,127 B2 | | 11/2008 | Wu et al. |
| 2004/0115924 A1 | * | 6/2004 | Lee et al. ............... 438/629 |
| 2006/0099764 A1 | | 5/2006 | Zuniga et al. |

FOREIGN PATENT DOCUMENTS

CN 1606811 A 4/2005

OTHER PUBLICATIONS

Sakai, S., et al., "Deposition Uniformity Control in a Commercial Scale HTO-CVD Reactor," Mater. Res. Soc. Symp. Proc., vol. 989, 2007, 6 pgs.

* cited by examiner

*Primary Examiner* — Fernando L Toledo
*Assistant Examiner* — Ankush K Singal
(74) *Attorney, Agent, or Firm* — Slater & Matsil, L.L.P.

(57) ABSTRACT

A transistor suitable for high-voltage applications and a method of manufacture is provided. A first device is formed by depositing a dielectric layer and a conductive layer over a substrate. A hard mask is deposited over the conductive layer and patterned using photolithography techniques. The photoresist material is removed prior to etching the underlying conductive layer and dielectric layer. The hard mask is also used as an implant mask. Another mask may be deposited and formed over the conductive layer to form other devices in other regions of the substrate. The other mask is preferably removed from over the hard mask prior to etching the conductive layer and the dielectric layer.

23 Claims, 7 Drawing Sheets

HIGH VOLTAGE SEMICONDUCTOR DEVICES

TECHNICAL FIELD

The present invention relates generally to semiconductor devices and, more particularly, to high-voltage semiconductor devices.

BACKGROUND

Size reduction of complementary metal-oxide-semiconductor (CMOS) devices, such as transistors, has enabled the continued improvement in speed, performance, density, and cost per unit function of integrated circuits over the past few decades. As sizes are reduced, there has been a trend to integrate more functions on a single chip, some of which require higher voltage levels.

Low-voltage devices are typically formed using self-aligning doping techniques in which the polysilicon gate electrode acts as a mask during implanting processes to form the source and drain regions. High-voltage devices, however, require the implanting processes to be performed at a higher energy level and a higher doping concentration to form the source/drain regions. Because of these higher energy levels and doping concentrations, the polysilicon gate electrode is not typically thick enough to prevent dopants to be improperly implanted in the channel region.

In an attempt to solve this problem, attempts have been made to place a hard mask with an overlying photoresist layer on top of the polysilicon gate electrode of the high-voltage devices. In these attempts, however, the hard mask layer on top of the polysilicon gate electrode is etched multiple times, including a wet etch followed by a dry etch using a photoresist mask. This process flow typically created a hard mask profile that created a non-uniform dopant concentration in the p-base implant region. As a result, the threshold voltage $V_t$ is inconsistent and frequently leads to inconsistent and faulty devices.

Accordingly, there is a need for high-voltage devices that may be fabricated consistently and uniformly, particularly in conjunction with low-voltage devices.

SUMMARY OF THE INVENTION

These and other problems are generally reduced, solved or circumvented, and technical advantages are generally achieved, by embodiments of the present invention, which provides high-voltage semiconductor devices.

In accordance with an embodiment of the present invention, a method of forming a semiconductor device is provided. The method comprises providing a substrate and sequentially forming a dielectric layer, a conductive layer, and a hard mask layer. The hard mask layer is patterned using a photoresist material, which is then removed, to form a patterned hard mask. After removing the photoresist material, the patterned hard mask is used to pattern the dielectric layer and the conductive layer. The patterned hard mask may also be used as an implant mask. Source/drain regions may also be formed to form a transistor, such as a high-voltage transistor.

In another embodiment, another device, such as a low-voltage transistor, is formed in another region of the substrate. In this embodiment, another patterned mask is formed in the second region, the material of the other patterned mask not being on the patterned hard mask.

In yet another embodiment, another method of forming a semiconductor device is provided. A dielectric layer and a conductive layer is formed over the substrate in a first region and a second region. A first mask is formed over the conductive layer in the first region and a second mask is formed over the conductive layer in the second region. The conductive layer is etched wherein the first mask and the second mask are uncovered during the etching process.

It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

The object and other advantages of this invention are best described in the preferred embodiment with reference to the attached drawings that include.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

FIGS. 1-7 illustrate various stages of fabricating a semiconductor device having a first high-voltage transistor, a second high-voltage transistor, and a low-voltage transistor in accordance with an embodiment of the present invention. It should be noted that the following method illustrates the formation of one of each of these transistors for illustrative purposes only, and embodiments of the present invention may be used to fabricate semiconductor devices having any combination of one or more these transistors.

It should also be noted that embodiments of the present invention may be used in any application in which a hard mask in a self-aligning implant procedure and a uniform profile on the hard mask is required to insure uniform doping. Applications in which embodiments of the present invention may be useful include PWM controller, Class-D amplifier, a photo flash charger, DC converter, and the like.

Furthermore, embodiments of the present invention will be described in terms of forming NMOS high-voltage transistors and an NMOS low-voltage transistor. One of ordinary skill in the art will appreciate that other embodiments of the present invention may be utilized to fabricate PMOS high-voltage transistors and PMOS low-voltage transistors. Yet other embodiments of the present invention may be utilized to fabricate any combination of one or more of an NMOS high-voltage transistor, an NMOS low-voltage transistor, a PMOS high-voltage transistor, and/or a PMOS low-voltage transistor on a single wafer.

Figure 1:
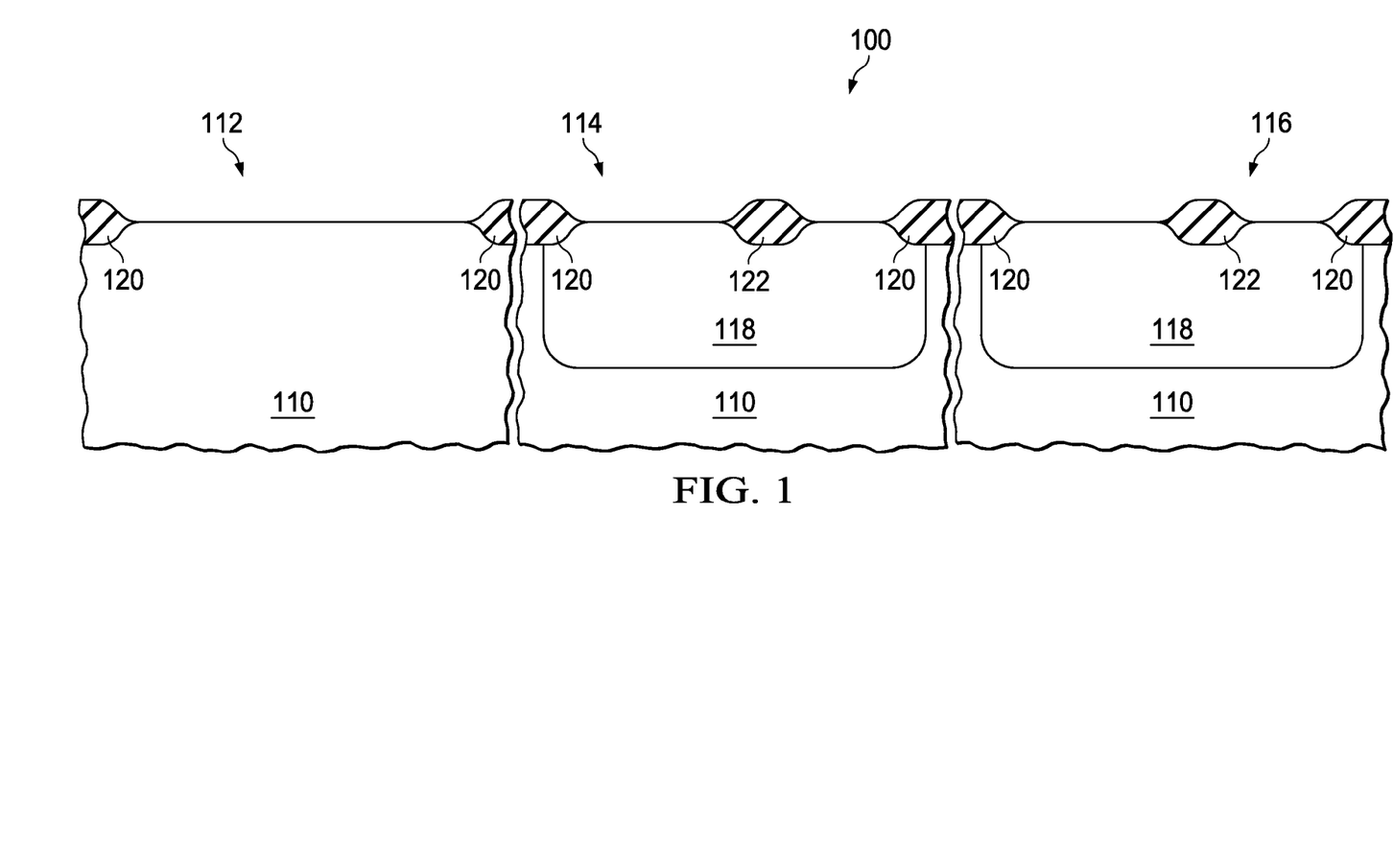
FIGS. 1-7 illustrate cross-sections of a wafer after various process steps have been performed to fabricate a semiconductor device in accordance with an embodiment of the present invention.

Referring first to FIG. 1, a portion of a wafer 100 is shown comprising a substrate 110 having a low-voltage region 112, a first high-voltage region 114, and a second high-voltage region 116. It should be noted that the following embodiment illustrates forming different types of high-voltage transistors wherein one type of high-voltage transistor will be formed in the first high-voltage region 114 and a second type of high-voltage transistor will be formed in the second high-voltage region 116. This illustrates that techniques discussed herein may be used in various embodiments wherein different types of transistors, high voltage and/or low voltage, may be combined. In the embodiment discussed herein, the transistors formed in the first high-voltage region 114 may be used in situations such as PMW controller, class-D amp, LED driver, and the like, and the second high-voltage region 116 may be used in situations such as a TFT driver, PMW controller, and the like.

In an embodiment, the substrate 110 comprises a bulk silicon substrate. Other materials, such as germanium, silicon-germanium alloy, or the like, could alternatively be used for the substrate 110. Additionally, the substrate 110 may be a semiconductor-on-insulator (SOI) substrate, a silicon-on-sapphire substrate (SOS), or a multi-layered structure, such as a silicon-germanium layer formed on a bulk silicon layer. Other materials may be used. It should be noted that the embodiment discussed herein assumes that the substrate 110 is a P-type substrate for illustrative purposes only and that other types of substrates may be used.

Deep N-wells 118 may be formed in the first high-voltage region 114 and the second high-voltage region 116 by masking (not shown) the substrate 110 and implanting N-type ions. It is preferred that the deep N-wells 118 be formed such that the deep N-wells 118 extends from the surface of the substrate 110 to about 4 um to about 6 um below the surface of the substrate 110. The deep N-wells 118 may be doped with, for example, an N-type dopant, such as phosphorous ions, at a dose of about 1E12 to about 4E12 atoms/cm$^2$ and at an energy of about 100 to about 180 KeV. Alternatively, the deep N-wells 118 may be doped with other N-type dopants such as arsenic, antimony, or the like.

First isolation regions 120, such as shallow-trench isolations (STIs), field oxide regions (FOX) or the like, may be formed in the substrate 110 to isolate active areas on the substrate. STIs may be formed by etching trenches in the substrate and filling the trenches with a dielectric material, such as silicon dioxide, high-density plasma (HDP) oxide, or the like. FOX regions may be formed by patterning a mask over the substrate and oxidizing exposed regions of the substrate 110 corresponding to the first isolation regions 120. It should be noted that FIGS. 1-7 illustrate an embodiment in which the isolation regions 120 are FOX regions, but as discussed above other embodiments may use STIs.

Second isolation regions 122 may be added in the first high-voltage region 114 and the second high-voltage region 116 in a similar manner as the first isolation regions 120 to provide further insulation and prevent or reduce gate leakage if desired for a specific application. Applications in which the second isolation regions 122 may be useful include applications using body contacts, laterally-diffused drains, double-diffused drains, and the like.

Figure 2:
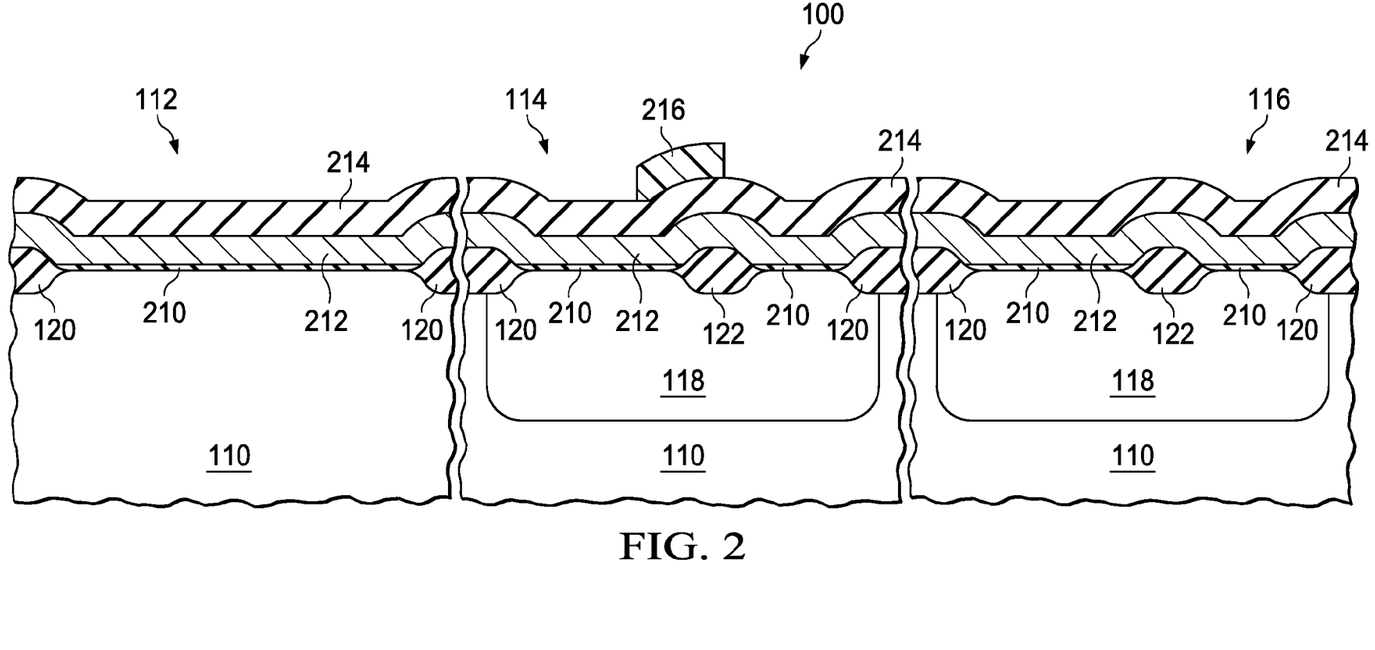

FIG. 2 illustrates the wafer 100 of FIG. 1 after a dielectric layer 210 and a conductive layer 212 have been formed in the low-voltage region 110, the first high-voltage region 114, and the second high-voltage region 116 in accordance with an embodiment of the present invention. The dielectric layer 210 comprises a dielectric material, such as silicon dioxide, silicon oxynitride, silicon nitride, a nitrogen-containing oxide, a combination thereof, or other dielectric material, but preferably a dielectric material having a high dielectric constant (e.g., a high-K dielectric). A silicon dioxide dielectric layer may be formed, for example, by an oxidation process, such as wet or dry thermal oxidation.

In a preferred embodiment, the dielectric layer 210 is thicker in the first high-voltage region 114 and the second high-voltage region 116 than in the low-voltage region 112. This may be achieved by, for example, patterning a mask covering the low-voltage region 112 and exposing the first high-voltage region 114 and the second high-voltage region 116, oxidizing the exposed portions of the substrate 110 in first high-voltage region 114 and the second high-voltage region 116, removing the mask, and oxidizing the exposed portions of the substrate in each of the low-voltage region 112, the first high-voltage region 114 and the second high-voltage region 116. In other embodiments, the low-voltage region 112 may be masked while forming the dielectric layer 210 in the first high-voltage region 114 and the second high-voltage region 116, and then the first high-voltage region 114 and the second high-voltage region 116 may be masked while forming the dielectric layer 210 in the low-voltage region 112. Preferably, the dielectric layer 210 has a thickness from about 80 Å to about 150 Å in the low-voltage region 112 and has a thickness from about 200 Å to about 500 Å in the high-voltage region 114. Other processes, materials, and thicknesses may be used.

The conductive layer 212 comprises a conductive material, such as a metal (e.g., tantalum, titanium, molybdenum, tungsten, platinum, aluminum, hafnium, ruthenium), a metal silicide (e.g., titanium silicide, cobalt silicide, nickel silicide, tantalum silicide), a metal nitride (e.g., titanium nitride, tantalum nitride), doped poly-crystalline silicon, other conductive materials, a combination thereof, or the like. In one example, amorphous silicon is deposited and re-crystallized to create poly-crystalline silicon (polysilicon). The polysilicon layer may be formed by depositing doped or undoped polysilicon by low-pressure chemical vapor deposition (LPCVD) to a thickness in the range of about 1000 Å to about 4000 Å, but more preferably about 1500 Å to about 2000 Å.

In another embodiment, the conductive layer 212 is a multi-layer structure. For example, in an embodiment, the conductive layer 212 comprises a polysilicon layer with an overlying tungsten silicide layer. In this embodiment, the tungsten silicide layer may provide a lower contact resistance and better adhesive properties with an overlying via (not shown).

Also shown in FIG. 2 are a hard mask layer 214 and a first patterned mask 216. Generally, as discussed in greater detail below, the hard mask layer 214 will be patterned to provide a mask for patterning the conductive layer 212 to form a gate electrode in the high-voltage region 114 in later etching processes. In an embodiment, the hard mask layer 214 comprises a tetra-ethyl-ortho-silicate (TEOS) layer, which is an oxide that may formed by thermal oxidation or by LPCVD techniques using tetra-ethyl-ortho-silicate (TEOS) and oxygen as precursor. The hard mask layer 214 is preferably about 1500 Å to about 5000 Å in thickness, but more preferably about 3000 Å in thickness. Other materials, such as a silicon nitride $Si_xN_y$, silicon oxynitride $SiO_xN_y$, an oxide, a doped oxide, a nitrogen-containing layer, combinations thereof, or the like, may also be used.

The hard mask layer 214 is preferably patterned using the first patterned mask 216. The first patterned mask 216 preferably comprises a photoresist material that has been deposited, masked, exposed, and developed. Generally, a photoresist material is irradiated (exposed) and developed to remove a portion of the photoresist material. The remaining photoresist material protects the underlying material from subsequent processing steps, such as etching. In the preferred embodiment, photoresist material is utilized to create a patterned mask to define the first patterned mask 216 as illustrated in FIG. 2.

Figure 3:
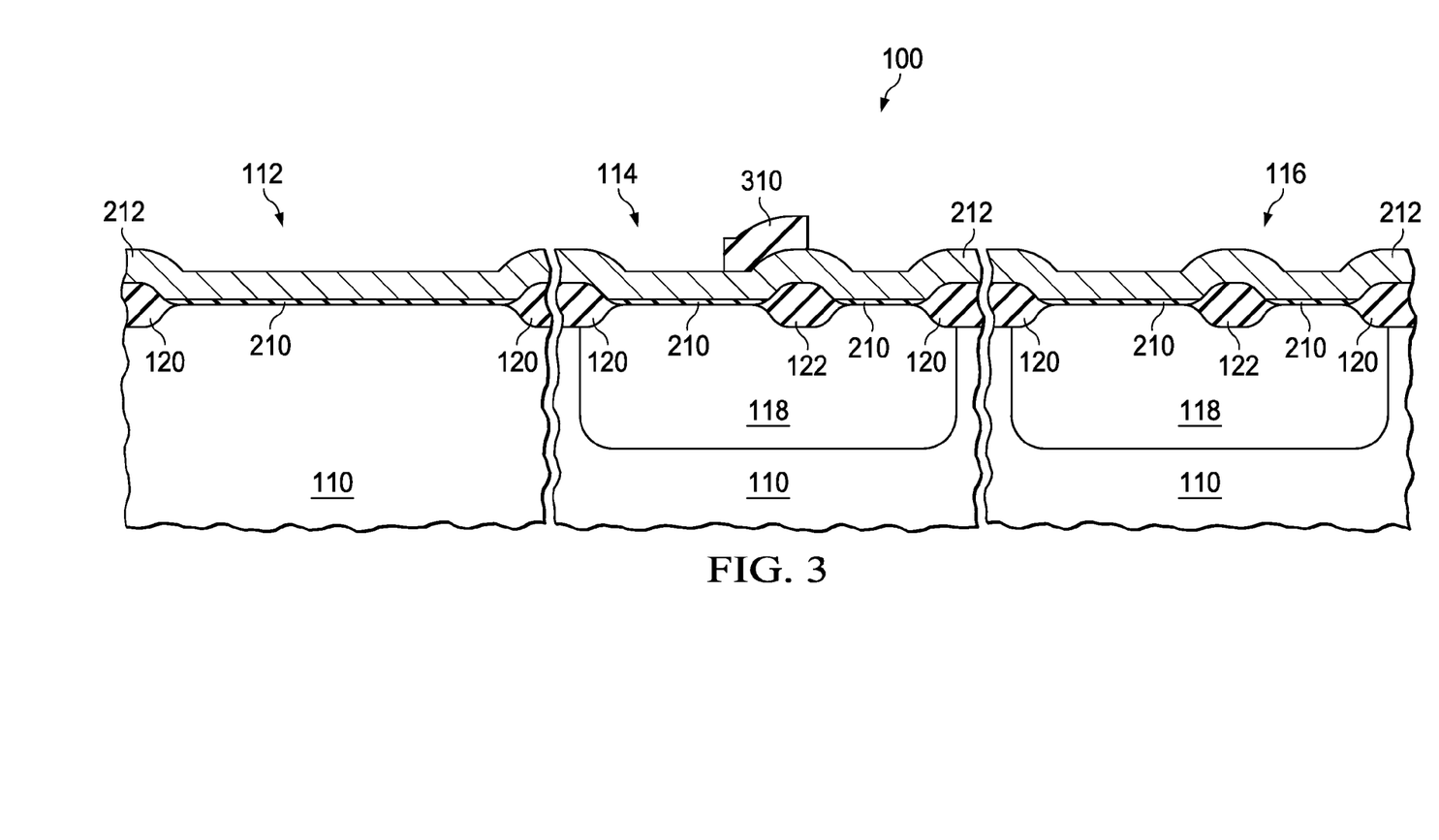

FIG. 3 illustrates the wafer 100 of FIG. 2 after the hard mask layer 210 (FIG. 2) has been patterned to form a patterned hard mask 310 in the high-voltage region 114 in accordance with an embodiment of the present invention. In an embodiment, the etching process to pattern the hard mask layer 210 (FIG. 2) is preferably an anisotropic dry etch process, such as a reactive ion etch (RIE).

It has been found that patterning the hard mask layer 210 to form the patterned hard mask 310 in this manner provides a patterned hard mask 310 with a better and more uniform profile. In particular, in some cases it has been found that patterning the hard mask layer 210 with a wet etch followed by a dry etch process may result in a patterned hard mask 310 having a slope of about 70 degrees relative to the surface of the substrate 110. On the other hand, embodiments of the present invention in which the patterned hard mask 310 is patterned using a single etch process, such as an anisotropic dry etch process, may provide a profile closer to normal to the substrate 110. In an embodiment, a profile having a slope of about 86 degrees relative to the surface of the substrate 110 was achieved.

Figure 4:
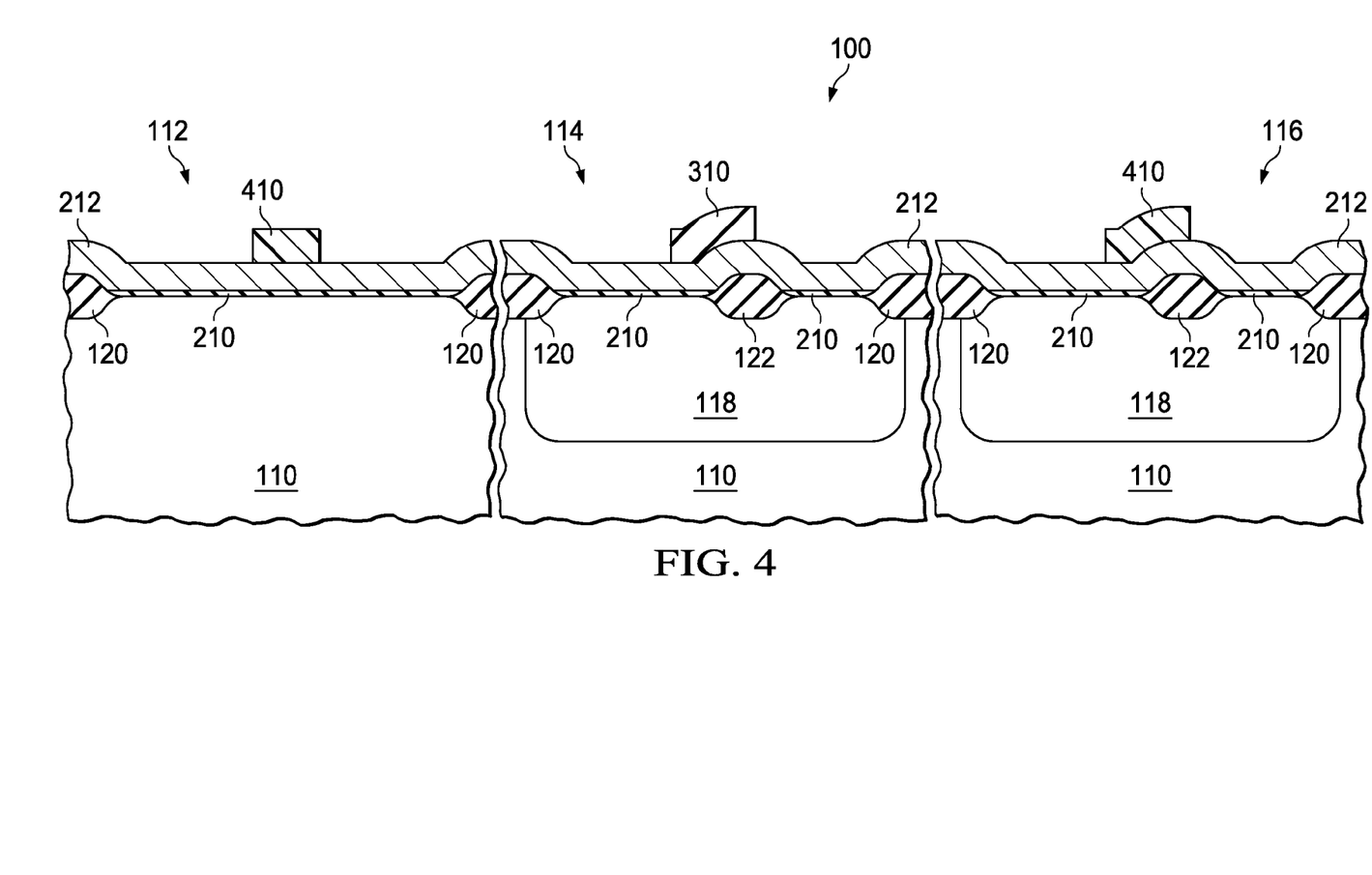

FIG. 4 illustrates the wafer 100 of FIG. 3 after second patterned masks 410 has been formed in the low-voltage region 112 and the second high-voltage region 116 in accordance with an embodiment of the present invention. The second patterned masks 410 may be formed in the same general manner as the first patterned mask 216, e.g., depositing, masking, exposing, and developing a layer of photoresist material to form the second patterned mask 410 as illustrated in FIG. 4. It should be noted that in the preferred embodiment, the material used to form the second patterned mask 410 has been removed from over the patterned hard mask 310. In this manner the thickness and shape of the masking material may be controlled better, thereby allowing greater control in later implant processes. Accordingly, in an embodiment, the first patterned mask 410 and the second patterned mask 310 are formed of different materials.

Figure 5:
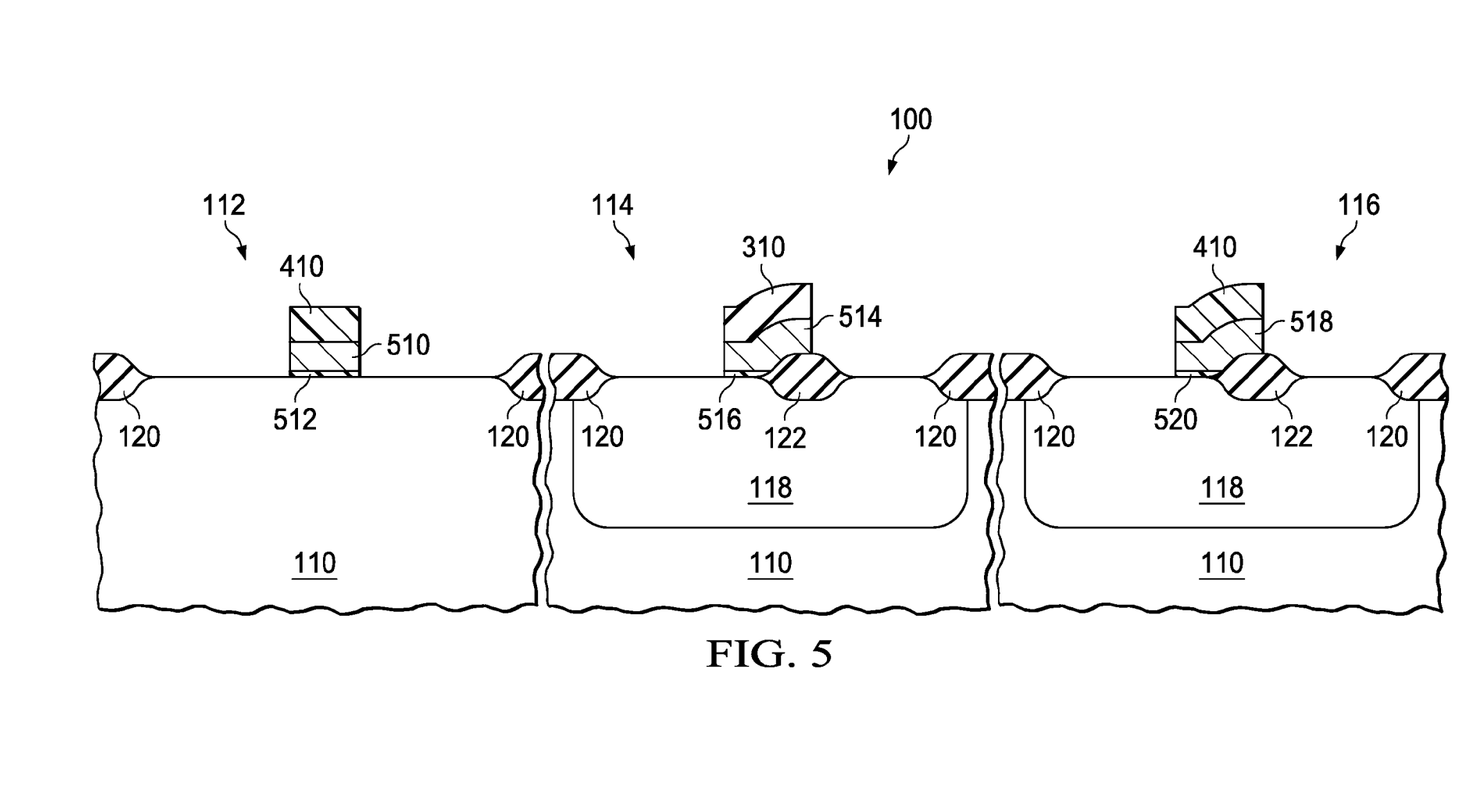

FIG. 5 illustrates the wafer 100 of FIG. 4 after the conductive layer 210 and the first dielectric layer 212 have been patterned to form a low-voltage gate electrode 510, a low-voltage gate dielectric 512, a first high-voltage gate electrode 514, a first high-voltage gate dielectric 516, a second high-voltage gate electrode 518, a second high-voltage gate dielectric 520 in accordance with an embodiment of the present invention. In an embodiment in which the conductive layer 210 comprises polysilicon and the first dielectric layer 212 comprises silicon oxide, an etching process such as a wet or dry, anisotropic or isotropic etch process, but preferably an anisotropic dry etch process, may be used to form the low-voltage gate electrode 510, the low-voltage gate dielectric 512, the first high-voltage gate electrode 514, the first high-voltage gate dielectric 516, the second high-voltage gate electrode 518, the second high-voltage gate dielectric 520.

Figure 6:
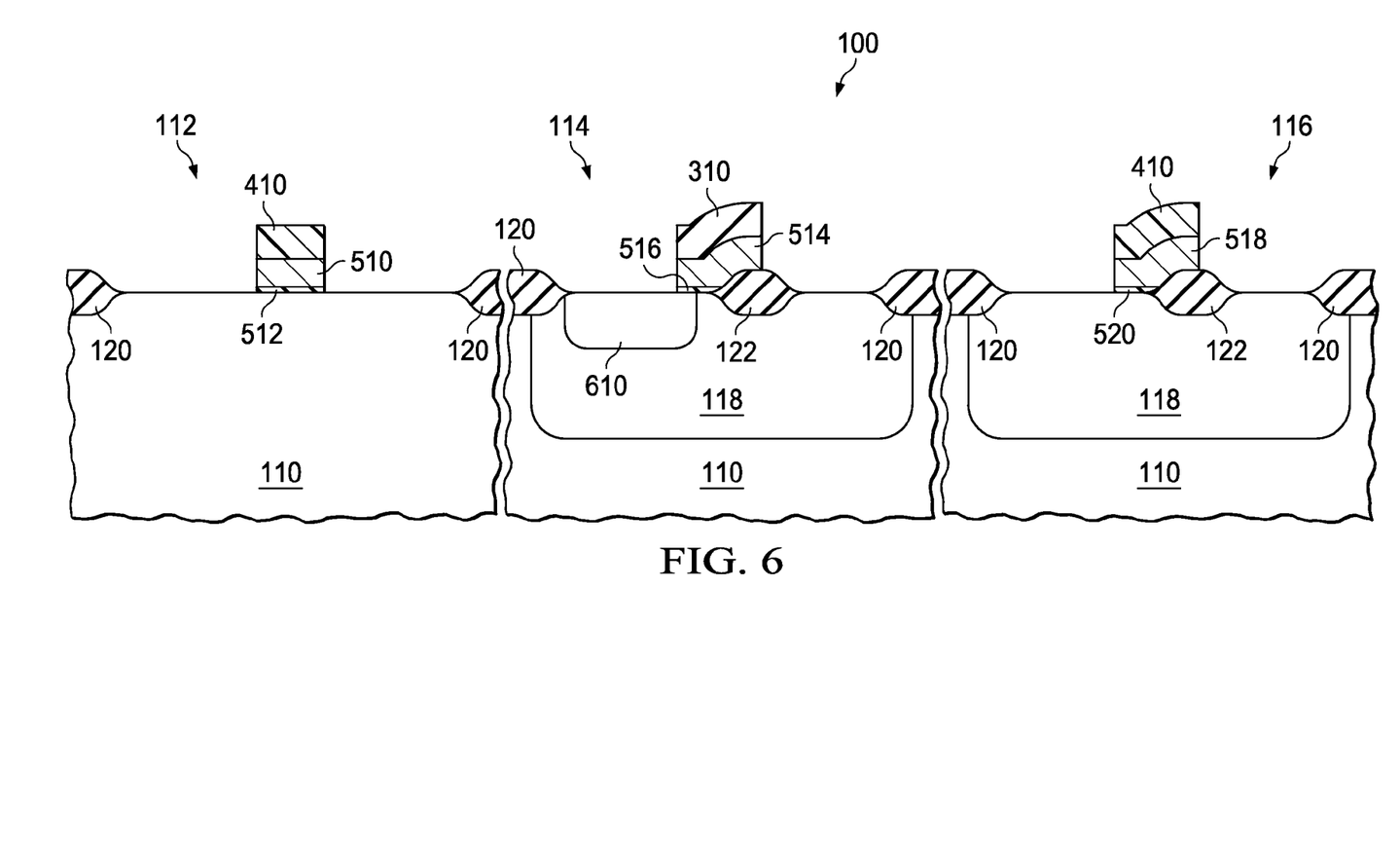

FIG. 6 illustrates the wafer 100 of FIG. 5 after P-base region 610 has been performed in the first high-voltage region 114 in accordance with an embodiment of the present invention. In an embodiment, the P-base region 610 is formed by two implant processes as indicated by arrows 612 and 614. A first implant process, indicated by reference numeral 612, is performed to implant P-type dopants, such as boron ions at a dose of about 1E13 to about 4E13 atoms/cm$^2$ and at an energy of about 50 to about 100 KeV at an implant angle of about 45 degrees from normal to the surface of the substrate 110. A second implant process, indicated by reference numeral 614, is performed to implant P-type dopants at a dose of about 3E13 to about 7E13 atoms/cm$^2$ and at an energy of about 60 to about 1100 KeV at an implant angle of about 7 degrees from normal to the surface of the substrate 110. In an embodiment, the P-base region 610 has a depth of about 1 μm to about 2 μm below the surface of the substrate 110 and extends below the gate dielectric from about 0.2 μm to about 0.7 μm. An implant mask (not shown) over the low-voltage region 112 prevents implanting ions in the low-voltage region 112.

Figure 7:
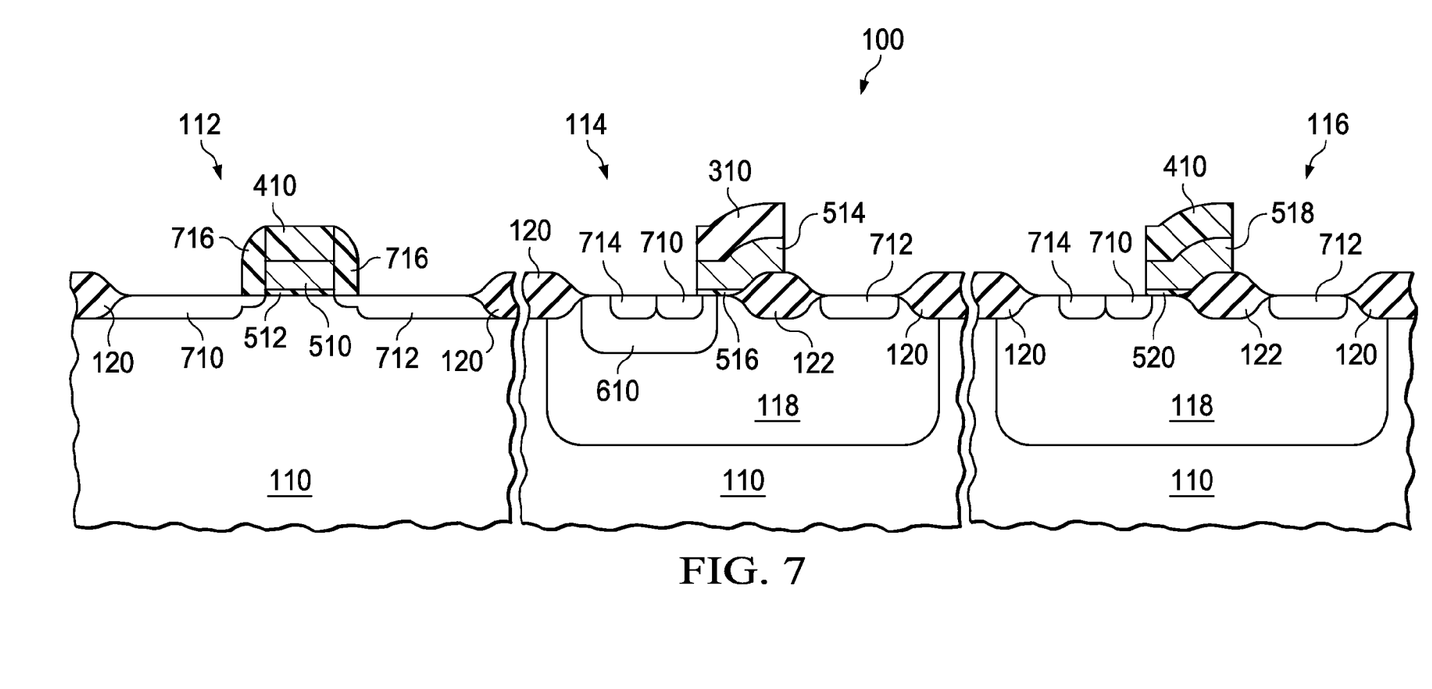

FIG. 7 illustrates the wafer 100 of FIG. 6 after source regions 710, drain regions 712, and bulk contacts 714 have been formed in accordance with an embodiment of the present invention. The source regions 710 and the drain regions 712 may be formed using one or more implant processes and one or more spacers, such as spacers 716 in the low-voltage region 112, using N-type dopants. In a preferred embodiment, the source regions 710 and the drain regions 712 comprise laterally-diffused drains as is known in the art. However, additional doping profiles, spacers, and the like may be used. For example, the source regions 710 and the drain regions 712 may comprise vertically-diffused drains, lightly-doped drains, double-diffused drains, or the like.

It should be noted that the process conditions used to form the source regions 710 and the drain regions 712 in the low-voltage region 112, the first high-voltage region 114, and the second high-voltage region 116 may each be different. For example, the dopants, the implant angle, the dose, the energy levels, and/or the like may vary.

In the first high-voltage region 114, the bulk contact 714 is preferably formed within the P-base region 610 using dopants of the same conductivity type, but at a higher concentration, as that used to form the P-base region 610. In an embodiment, the bulk contact 714 is formed by implanting P-type dopants, such as boron ions, at a dose of about 1E15 to about 4E15 atoms/cm$^2$ and at an energy of about 30 to about 60 KeV at an implant angle of about 0 degrees to about 10 degrees, relative to normal to the surface of the substrate 110.

Thereafter, standard processes may be used to complete fabrication of the wafer 100 and to dice the wafer 100 into individual dies in preparation for packaging.

One of ordinary skill in the art will appreciate that embodiments of the present invention provide many advantages. For example, as discussed above embodiments of the present invention have been found to provide a more uniform threshold voltage $V_t$ while maintaining good $R_{dson}$ performance. Furthermore, embodiments of the present invention have also been found to decrease the standard deviation of the threshold voltage $V_t$ across a wafer from about 0.08 to about 0.037, thereby allowing for more uniform performance characteristics over a die as well as between dies on a wafer.

As another example, embodiments of the present invention have been found to increase the end-point process window. In one example, the end-point process window at the poly-etch stage was increased about 5-7 seconds, thereby decreasing the risk of damaging the substrate during etch processing.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming a semiconductor device, the method comprising:
   providing a substrate, the substrate having a first region and a second region;
   forming a first dielectric layer over the substrate in the first region and the second region;
   forming a conductive layer over the first dielectric layer in the first region and the second region;
   forming a first mask layer over the conductive layer in the first region and the second region;
   patterning the first mask layer to form a first patterned mask, the first mask layer being removed from the second region;
   forming a second mask layer over the conductive layer in the first region and the second region, the first mask layer comprising a different material than the second mask layer;
   patterning the second mask layer to form a second patterned mask, the second mask layer being removed from the first region;
   simultaneously patterning the conductive layer in the first region and the second region, thereby forming a first gate electrode in the first region and a second gate electrode in the second region;
   simultaneously patterning the first dielectric layer in the first region and the second region, thereby forming a first gate dielectric in the first region and a second gate dielectric in the second region; and
   implanting ions into the substrate using the first patterned mask as an implant mask.

2. The method of claim 1, wherein the patterning the first mask layer comprises:
   forming a first photoresist layer over the first mask layer;
   patterning the first photoresist layer, the first photoresist layer being removed from the second region;
   etching the first mask layer to form the first patterned mask; and
   removing the first photoresist layer from over the first patterned mask prior to the patterning the conductive layer.

3. The method of claim 1, wherein the first dielectric layer has a first thickness in the first region and a second thickness in the second region, wherein the first thickness is different than the second thickness.

4. The method of claim 1, wherein the implanting ions comprises performing a first implant at a first implant angle and performing a second implant at a second implant angle, the first implant angle is different than the second implant angle.

5. The method of claim 1, wherein the forming a first mask layer comprises forming a TEOS layer.

6. The method of claim 1, wherein the forming a first mask layer comprises forming a doped oxide layer.

7. The method of claim 1, wherein the forming a first mask layer comprises forming a nitrogen containing layer.

8. The method of claim 1, wherein the first mask layer has a thickness between about 1500 Å and about 5000 Å.

9. The method of claim 1, wherein the forming a first mask layer is performed at least in part by chemical vapor deposition.

10. The method of claim 1, wherein the forming a second mask layer comprises forming a photoresist layer.

11. The method of claim 2, wherein the etching is performed at least in part by a dry etch process.

12. The method of claim 3, wherein the first thickness is greater than the second thickness.

13. The method of claim 4, wherein the first implant angle is about 45 degrees.

14. The method of claim 4, wherein the second implant angle is about 7 degrees.

15. A method of forming a semiconductor device, the method comprising:
    providing a substrate, the substrate having a first region and a second region;
    forming a dielectric layer over the substrate in the first region and the second region;
    forming a conductive layer over the dielectric layer in the first region and the second region;
    forming a first mask over the conductive layer in the first region and a second mask over the conductive layer in the second region, the first mask comprising a different material than the second mask, the first mask not being over the conductive layer in the second region; and
    etching the conductive layer wherein the first mask and the second mask act as etching masks, the first mask and the second mask being uncovered during the etching process.

16. The method of claim 15, wherein the etching the conductive layer forms a first gate electrode in the first region and a second gate electrode in the second region and further comprising forming a first transistor using the first gate electrode in the first region and forming a second transistor using the second gate electrode in the second region, the first transistor being a low-voltage transistor and the second transistor being a high-voltage transistor.

17. The method of claim 15, wherein the first mask comprises a photoresist material and the second mask comprises an oxide and wherein the dielectric layer is thinner in the first region than in the second region.

18. A method of forming a semiconductor device, the method comprising:
    providing a substrate, the substrate having a first region and a second region;
    providing a dielectric layer over the substrate and a conductive layer over the dielectric layer;
    forming a first mask in the first region and a second mask in the second region, the first mask being formed from a different layer than the second mask, the first mask being removed from the second region;
    patterning the dielectric layer and the conductive layer in the first region using the first mask and in the second region using the second mask; and
    performing an implant in the first region and the second region, the implant in the first region using the first mask as an implant mask.

19. The method of claim 18, wherein the forming a first mask in the first region and a second mask in the second region comprises:
    forming a first mask layer over the first region and the second region;
    patterning the first mask layer to form the first mask;
    removing the first mask layer from the second region;
    forming a second mask layer over the first region and the second region;

patterning the second mask layer to form the second mask; and removing the second mask layer from the first region.

20. The method of claim 19, wherein the patterning the first mask layer is performed at least in part by a dry etch process.

21. A method of forming a semiconductor device, the method comprising:

providing a substrate, the substrate having a first region and a second region;

forming a dielectric layer over the substrate in the first region and the second region;

forming a conductive layer over the dielectric layer in the first region and the second region;

forming a first mask over the conductive layer in the first region and a second mask over the conductive layer in the second region, the first mask comprising a different material than the second mask; and etching the conductive layer wherein the first mask and the second mask act as etching masks, the first mask and the second mask being uncovered during the etching process, wherein the etching the conductive layer forms a first gate electrode in the first region and a second gate electrode in the second region and further comprising forming a first transistor using the first gate electrode in the first region and forming a second transistor using the second gate electrode in the second region, the first transistor being a low-voltage transistor and the second transistor being a high-voltage transistor.

22. A method of forming a semiconductor device, the method comprising:

providing a substrate, the substrate having a first region and a second region;

forming a dielectric layer over the substrate in the first region and the second region;

forming a conductive layer over the dielectric layer in the first region and the second region;

forming a first mask over the conductive layer in the first region and a second mask over the conductive layer in the second region, the first mask comprising a different material than the second mask, wherein the first mask comprises a photoresist material and the second mask comprises an oxide and wherein the dielectric layer is thinner in the first region than in the second region; and etching the conductive layer wherein the first mask and the second mask act as etching masks, the first mask and the second mask being uncovered during the etching process.

23. A method of forming a semiconductor device, the method comprising:

providing a substrate, the substrate having a first region and a second region;

providing a dielectric layer over the substrate and a conductive layer over the dielectric layer;

forming a first mask layer over the first region and the second region;

patterning the first mask layer to form a first mask;

removing the first mask layer from the second region;

forming a second mask layer over the first region and the second region, the first mask being formed from a different layer than a second mask;

patterning the second mask layer to form the second mask; and removing the second mask layer from the first region;

patterning the dielectric layer and the conductive layer in the first region using the first mask and in the second region using the second mask; and performing an implant in the first region and the second region, the implant in the first region using the first mask as an implant mask.

* * * * *